US012602099B2

(12) United States Patent
    Qiang

(10) Patent No.: US 12,602,099 B2
(45) Date of Patent: Apr. 14, 2026

(54) POWER-ON OPERATION EXECUTION METHOD AND APPARATUS

(71) Applicant: Tencent Technology (Shenzhen) Company Limited, Shenzhen (CN)

(72) Inventor: Peng Qiang, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 0 days.

(21) Appl. No.: 18/212,292

(22) Filed: Jun. 21, 2023

(65) Prior Publication Data

US 2023/0333615 A1      Oct. 19, 2023

Related U.S. Application Data

(63) Continuation of application No. PCT/CN2022/120384, filed on Sep. 22, 2022.

(30) Foreign Application Priority Data

Nov. 18, 2021    (CN) .......................... 202111371585.4

(51) Int. Cl.
    *G06F 1/00*          (2006.01)
    *G06F 1/26*          (2006.01)
    *H03L 7/08*          (2006.01)
(52) U.S. Cl.
    CPC . *G06F 1/26* (2013.01); *H03L 7/08* (2013.01)
(58) Field of Classification Search
    CPC ..................................... G06F 1/26; H03L 7/08
    See application file for complete search history.

(56) References Cited

U.S. PATENT DOCUMENTS

| 5,848,277 | A | * | 12/1998 | Javernick | ................ | G06F 13/24 |
| | | | | | | 710/262 |
| 6,686,803 | B1 | | 2/2004 | Perrott et al. | | |
| 9,467,120 | B1 | | 10/2016 | Song | | |
| 11,500,808 | B1 | * | 11/2022 | Ganor | ................ | G06F 13/4027 |

(Continued)

FOREIGN PATENT DOCUMENTS

| CN | 103746845 A | 4/2014 |
| CN | 107341124 | 11/2017 |

(Continued)

OTHER PUBLICATIONS

CN113553101: Li Gaojian.*

(Continued)

*Primary Examiner* — Mohammed H Rehman
(74) *Attorney, Agent, or Firm* — Crowell & Moring LLP

(57) ABSTRACT

A power-on operation execution method and apparatus are provided. The method includes: starting a processor of the chip in response to the chip being connected to a host and a frequency of a first clock signal of the chip being switched to a stable state; receiving a reset signal transmitted from the host, the reset signal being transmitted in response to a frequency of a second clock signal of the host being switched to a stable state; and executing a power-on operation in response to the reset signal, a time point at which the frequency of the first clock signal is switched to the stable state being earlier than a time point at which the frequency of the second clock signal is switched to the stable state.

12 Claims, 8 Drawing Sheets

(56) References Cited

U.S. PATENT DOCUMENTS

| | | | | |
|---|---|---|---|---|
| 2015/0303909 | A1* | 10/2015 | Arcudia ................ | H03L 7/0807 |
| | | | | 327/158 |
| 2016/0087723 | A1* | 3/2016 | Zhang ................ | H04B 10/2507 |
| | | | | 398/140 |
| 2017/0315956 | A1* | 11/2017 | Choi ........................ | G06F 1/266 |
| 2018/0276357 | A1* | 9/2018 | Tsuboi ................... | G06K 19/07 |
| 2019/0391944 | A1* | 12/2019 | Seiler .............. | G06K 19/07732 |
| 2020/0017114 | A1* | 1/2020 | Santoni .............. | G06F 11/1641 |
| 2020/0034321 | A1* | 1/2020 | Ono ........................ | G06F 13/38 |
| 2020/0344066 | A1* | 10/2020 | Nomura .................... | H04L 9/30 |
| 2021/0232690 | A1* | 7/2021 | Nomura ............... | G06F 21/572 |
| 2021/0406166 | A1* | 12/2021 | Ramesh ............. | G06F 12/0246 |
| 2022/0083717 | A1* | 3/2022 | Lo ........................ | G06F 30/3323 |
| 2022/0382692 | A1* | 12/2022 | Jeon .................... | G06F 11/0772 |
| 2023/0018476 | A1* | 1/2023 | Soumpholphakdy ... | G06F 1/305 |
| 2024/0146501 | A1* | 5/2024 | Chen ........................ | G06F 1/12 |

FOREIGN PATENT DOCUMENTS

| | | | | | |
|---|---|---|---|---|---|
| CN | 110781121 | | 2/2020 | | |
| CN | 111966189 | A | 11/2020 | | |
| CN | 113553101 | A | * | 7/2021 | .............. G06F 9/30 |
| CN | 113467837 | A | | 10/2021 | |
| CN | 113553101 | | | 10/2021 | |

OTHER PUBLICATIONS

Extended European Search Report issued in European application No. 22894439.3, dated Nov. 15, 2024, 13 pages.

No Author Listed, "PCI Express Base Specification Revision 5.0 Version 1.0," dated May 2019, pp. 1-28, 89-102,309-310, 312-317, 552-557, 1061, 1062, 1085, 1098.

No Author Listed, "PCI Express SFF-8639 Module Specification Revision 4.0 Version 1.0," dated Mar. 2021, pp. 16-28, pp. 38-39, pp. 42-45.

International Search Report issued Dec. 15, 2022 in International (PCT) Application No. PCT/CN2022/120384.

Chinese-language Office Action issued in Chinese Application No. 202111371585.4 dated Jan. 29, 2026, with English translation (12 pages).

* cited by examiner

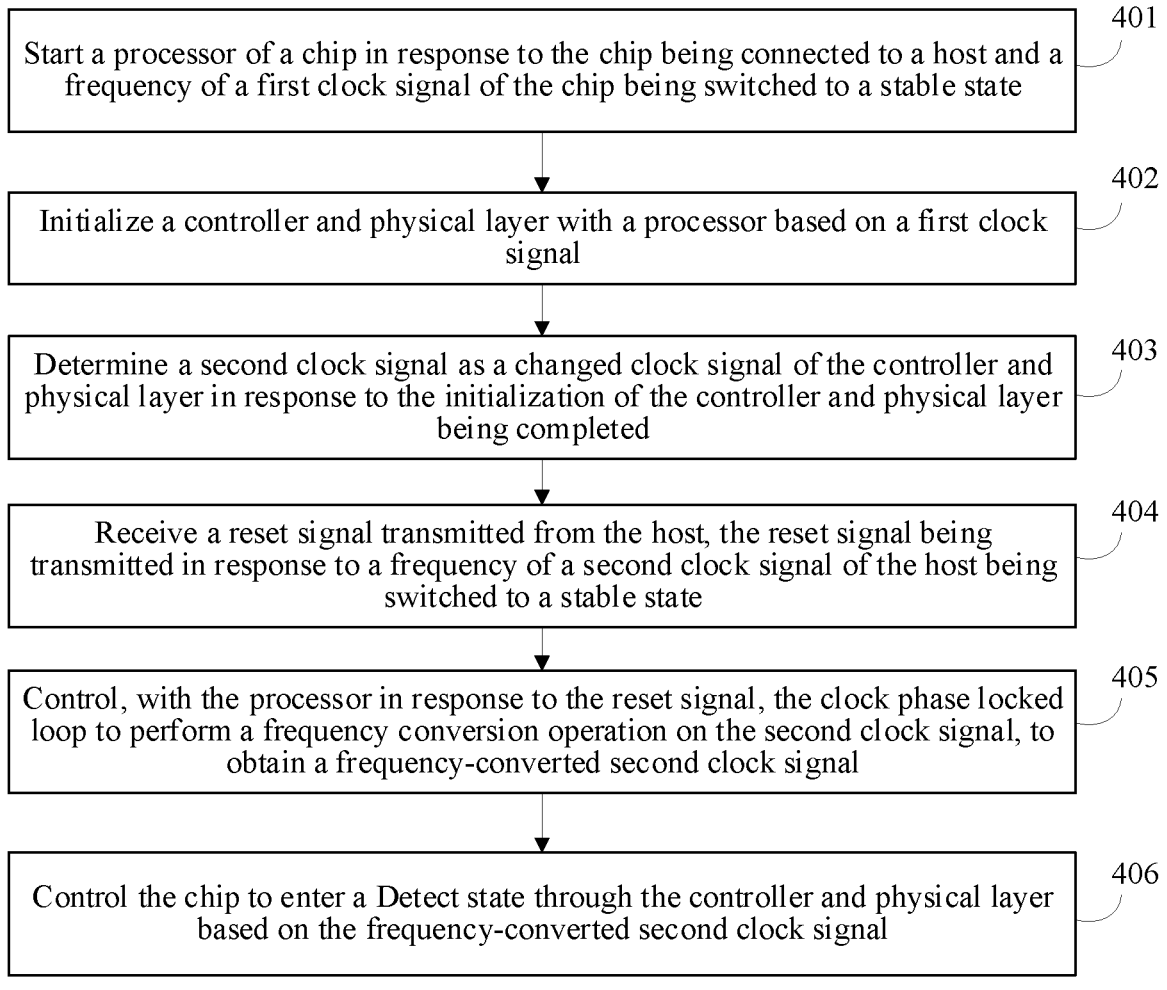

Start a processor of a chip in response to the chip being connected to a host and a frequency of a first clock signal of the chip being switched to a stable state     401

Initialize a controller and physical layer with a processor based on a first clock signal     402

Determine a second clock signal as a changed clock signal of the controller and physical layer in response to the initialization of the controller and physical layer being completed     403

Receive a reset signal transmitted from the host, the reset signal being transmitted in response to a frequency of a second clock signal of the host being switched to a stable state     404

Control, with the processor in response to the reset signal, the clock phase locked loop to perform a frequency conversion operation on the second clock signal, to obtain a frequency-converted second clock signal     405

Control the chip to enter a Detect state through the controller and physical layer based on the frequency-converted second clock signal     406

FIG. 4

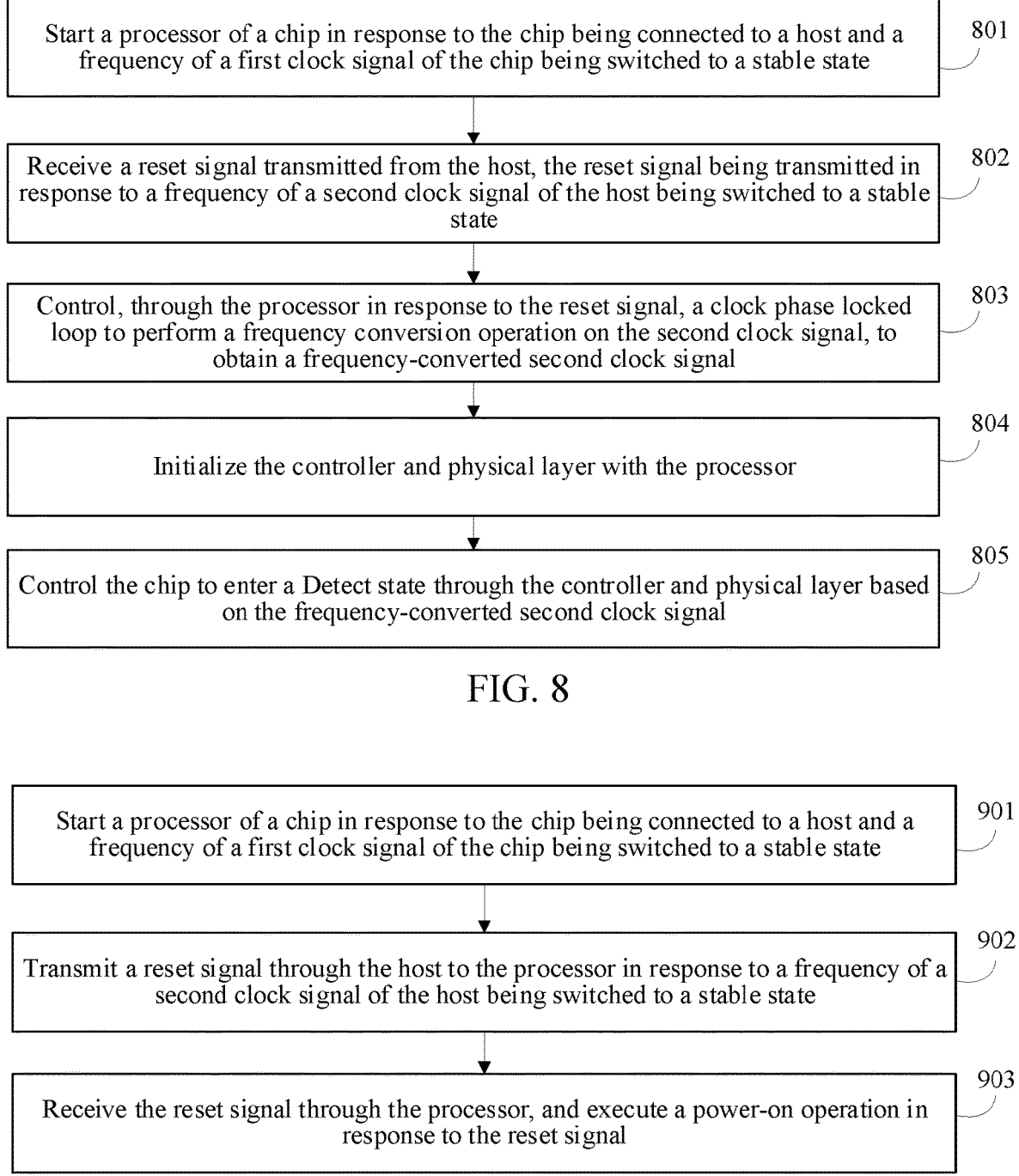

Start a processor of a chip in response to the chip being connected to a host and a frequency of a first clock signal of the chip being switched to a stable state — 801

Receive a reset signal transmitted from the host, the reset signal being transmitted in response to a frequency of a second clock signal of the host being switched to a stable state — 802

Control, through the processor in response to the reset signal, a clock phase locked loop to perform a frequency conversion operation on the second clock signal, to obtain a frequency-converted second clock signal — 803

Initialize the controller and physical layer with the processor — 804

Control the chip to enter a Detect state through the controller and physical layer based on the frequency-converted second clock signal — 805

FIG. 8

Start a processor of a chip in response to the chip being connected to a host and a frequency of a first clock signal of the chip being switched to a stable state — 901

Transmit a reset signal through the host to the processor in response to a frequency of a second clock signal of the host being switched to a stable state — 902

Receive the reset signal through the processor, and execute a power-on operation in response to the reset signal — 903

FIG. 9

POWER-ON OPERATION EXECUTION METHOD AND APPARATUS

RELATED APPLICATION

This application is a continuation application of PCT Patent Application No. PCT/CN2022/120384, filed on Sep. 22, 2022, which claims priority to Chinese Patent Application No. 202111371585.4, entitled "POWER-ON OPERATION EXECUTION METHOD AND APPARATUS, CHIP, ELECTRONIC DEVICE, AND COMPUTER PROGRAM PRODUCT" and filed on Nov. 18, 2021, wherein the content of the above-referenced applications is incorporated herein by reference in its entirety.

FIELD OF THE TECHNOLOGY

Embodiments of this disclosure relate to the field of computer technologies, and in particular, to a power-on operation execution method and apparatus, a chip, an electronic device, and a computer program product.

BACKGROUND OF THE DISCLOSURE

After a Peripheral Component Interconnect Express (PCIE) chip is connected to a PCIE host, a power-on process of the PCIE chip needs to meet a timing requirement of a PCIE protocol, and a duration of the power-on process cannot exceed 20 milliseconds.

However, in related technologies, it takes long time to power on the PCIE chip, which may not meet the timing requirement, easily causing the PCIE chip to fail in work. Therefore, it is urgent to provide a method for reducing the duration of the power-on process.

SUMMARY

According to various embodiments of this disclosure, power-on operation execution methods and apparatuses, a chip, an electronic device, and a computer program product. The technical solutions are as follows:

In one aspect, a power-on operation execution method is provided, performed by a chip and including:

starting a processor of the chip in response to the chip being connected to a host and a frequency of a first clock signal of the chip being switched to a stable state;

receiving a reset signal transmitted from the host, the reset signal being transmitted in response to a frequency of a second clock signal of the host being switched to a stable state; and executing a power-on operation in response to the reset signal, a time point at which the frequency of the first clock signal is switched to the stable state being earlier than a time point at which the frequency of the second clock signal is switched to the stable state.

In another aspect, a power-on operation execution method is provided, performed by an electronic device. The electronic device includes a chip and a host, and the method includes:

starting a processor of the chip in response to the chip being connected to the host and a frequency of a first clock signal of the chip is switched to a stable state;

transmitting a reset signal via the host to the processor in response to a frequency of a second clock signal of the host being switched to a stable state; and receiving the reset signal with the processor, and executing a power-on operation in response to the reset signal, a time point at which the frequency of the first clock signal is switched to the stable state being earlier than a time point at which the frequency of the second clock signal is switched to the stable state.

In another aspect, a power-on operation execution apparatus is provided, including a memory operable to store computer-readable instructions and a processor circuitry operable to read the computer-readable instructions. When executing the computer-readable instructions, the processor circuitry is configured to:

start a processor of a chip in response to the chip being connected to a host and a frequency of a first clock signal of the chip being switched to a stable state;

receive a reset signal transmitted from the host, the reset signal being transmitted in response to a frequency of a second clock signal of the host being switched to a stable state; and execute a power-on operation in response to the reset signal, a time point at which the frequency of the first clock signal is switched to the stable state being earlier than a time point at which the frequency of the second clock signal is switched to the stable state.

In another aspect, a chip is provided. The chip includes at least one computer-readable instruction, the chip, when run on an electronic device, being configured to achieve operations executed in the power-on operation execution method as mentioned above.

In another aspect, an electronic device is provided, including a chip and a host, the chip being configured to start a processor of the chip after the chip is connected to a host and when a frequency of a first clock signal of the chip is switched to a stable state;

the host being configured to transmit a reset signal to the processor after a frequency of a second clock signal of the host is switched to a stable state;

the chip being further configured to receive the reset signal through the processor, and execute a power-on operation in response to the reset signal, a time point at which the frequency of the first clock signal is switched to the stable state being earlier than a time point at which the second clock signal is switched to the stable state.

In another aspect, a computer program product is provided, including a computer-readable instruction. The computer-readable instruction, when executed by a processor, achieves operations executed in the power-on operation execution method as mentioned above.

BRIEF DESCRIPTION OF THE DRAWINGS

To describe the technical solutions of the embodiments of this disclosure more clearly, the following briefly introduces the accompanying drawings required for describing the embodiments. Apparently, the accompanying drawings in the following description show only some of the embodiments of this disclosure, and a person of ordinary skill in the art may still derive other drawings from these accompanying drawings without creative efforts.

FIG. 4 is a flowchart of another power-on operation execution method according to an embodiment of this disclosure.

FIG. 8 is a flowchart of still another power-on operation execution method according to an embodiment of this disclosure.

FIG. 9 is a flowchart of yet another power-on operation execution method according to an embodiment of this disclosure.

DESCRIPTION OF EMBODIMENTS

To make objectives, technical solutions, and advantages of the embodiments of this disclosure clearer, the following further describes in detail implementations of this disclosure with reference to the accompanying drawings.

It may be understood that the terms "first", "second", and the like used in this disclosure may be used for describing various concepts in this specification. However, the concepts are not limited by the terms unless otherwise specified. The terms are merely used for distinguishing one concept from another concept. For example, without departing from the scope of this disclosure, a first clock signal may be referred to as a second clock signal, and similarly, the second clock signal may be referred to as the first clock signal.

At least one refers to one or more. For example, at least one clock signal may be any integer number (greater than or equal to one) of clock signals, for example, one clock signal, two clock signals, and three clock signals. Plurality refers to two or more. For example, a plurality of clock signals may be two clock signals, three clock signals, or any integer number (greater than or equal to two) of clock signals. Each refers to each of at least one. For example, each clock signal refers to each of a plurality of clock signals. If a plurality of clock signals mean three clock signals, each clock signal refers to each of the three clock signals.

For ease of understanding of the embodiments of this disclosure, a chip provided by the embodiments of this disclosure is explained first. The chip may be applied to various types of electronic devices, for example, a mobile phone, a tablet, a laptop, a desktop computer, an intelligent voice interaction device, a smart speaker, a smart home appliance, a vehicle-mounted terminal, or the like. The chip may provide various types of functions. For example, the chip can provide functions of image processing, voice recognition, intelligent navigation, or the like.

In some embodiments, the chip is an Artificial Intelligence (AI) chip that uses an artificial intelligence technology to achieve the aforementioned functions.

In some embodiments, the chip can be applied to an electronic device (for example, a vehicle-mounted terminal) in an Intelligent Traffic System (ITS) to achieve intelligent navigation and other functions. The ITS integrates an advanced science and technology into transportation, service control, vehicle manufacturing and the like, to strengthen connection between vehicles, roads, and users, and form a comprehensive transportation system that ensures safety, improves efficiency, improves environments, and saves energy.

Figure 1:
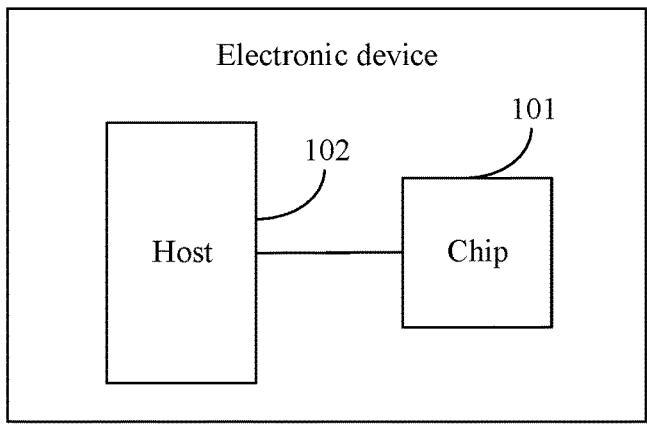
FIG. 1 is a schematic structural diagram of an electronic device according to an embodiment of this disclosure.

FIG. 1 is a schematic structural diagram of an electronic device according to an embodiment of this disclosure. The electronic device includes a chip 101 and a host 102. For example, the host 102 is a PCIE host, and the chip 101 is a PCIE chip. The chip 101 is configured to be connected to the host 102. After the chip 101 is connected to the host 102, a power-on operation needs to be executed on the chip 101. In this embodiment of this disclosure, the power-on operation refers to an operation executed in a process from the chip 101 receiving a reset signal (PERST #, PCI Express Reset) to the chip entering a Detect state. After the chip 101 is connected to the host 102, when a frequency of a first clock signal of the chip 101 is switched to a stable state, a processor of the chip 101 is started. After a frequency of a second clock signal of the host 102 is switched to a stable state, a reset signal is transmitted to the processor. The chip 101 receives the reset signal through the processor, and executes the power-on operation in response to the reset signal. A time point at which the frequency of the first clock signal to the stable state is earlier than a time point at which the second clock signal is switched to the stable state.

In an exemplary implementation, the chip 101 is initialized through the processor.

In an exemplary implementation, the chip includes a controller and a physical layer, and the chip 101 is configured to initialize the controller and physical layer through the processor.

In an exemplary implementation, the chip 101 is configured to initialize the controller and physical layer through the processor based on the first clock signal.

In an exemplary implementation, the chip 101 is configured to perform a frequency conversion operation on the first clock signal to obtain a frequency-converted first clock signal; and initialize the controller and physical layer through the processor based on the frequency-converted first clock signal.

In an exemplary implementation, during the initializing the controller and physical layer, a clock signal of the controller and physical layer is the first clock signal. The chip 101 is configured to determine the second clock signal as a changed clock signal of the controller and physical layer when the initialization of the controller and physical layer is completed. The first clock signal is a clock signal of the chip, and the second clock signal is a clock signal of the host.

In an exemplary implementation, the controller and physical layer is connected to a clock phase locked loop; and the chip 101 is configured to: when the initialization of the controller and physical layer is completed, control the first clock signal to be stopped from entering the clock phase locked loop, and control the second clock signal to enter the clock phase locked loop.

In an exemplary implementation, the clock phase locked loop is connected to a clock gating; the first clock signal enters the clock phase locked loop through the clock gating; and the chip 101 is configured to turn off clock gating to stop the first clock signal from entering the clock phase locked loop;

switch, when a duration after stopping the first clock signal from entering the clock phase locked loop reaches a first duration, the first clock signal reaching the clock gating to the second clock signal; and turn on the clock gating when a duration after switching the first clock signal reaching the clock gating to the second clock signal reaches a second duration, to enable the second clock signal to enter the clock phase locked loop.

In an exemplary implementation, the controller and physical layer is connected to a clock phase locked loop; the chip 101 is configured to control, through the processor in response to the reset signal, the clock phase locked loop to perform a frequency conversion operation on the second clock signal, to obtain a frequency-converted second clock signal; and control the chip to enter a Detect state through the controller and physical layer based on the frequency-converted second clock signal.

In an exemplary implementation, the chip 101 is configured to perform a frequency conversion operation on the second clock signal through the processor in response to the reset signal, to obtain a frequency-converted second clock signal; initialize the chip through the processor; and control the chip to enter a Detect state based on the frequency-converted second clock signal.

In an exemplary implementation, the chip includes a controller and a physical layer; and the controller and physical layer is connected to a clock phase locked loop. The chip 101 is configured to control, through the processor, the clock phase locked loop to perform the frequency conversion operation on the second clock signal, to obtain a frequency-converted second clock signal; initialize the controller and physical layer through the processor; and control the chip to enter a Detect state through the controller and physical layer based on the frequency-converted second clock signal.

In an exemplary implementation, the power-on operation includes a first operation executed by the processor, and the processor is configured to execute the first operation in response to an operation instruction corresponding to the first operation. The chip 101 is configured to perform at least one of the following items:

first: the chip further including other components besides the processor, controlling, during the executing the power-on operation, other components to stop transmitting, to the processor, operation instructions corresponding to other operations except the first operation; and second: making a response to the operation instructions through the processor according to priorities, the operation instruction corresponding to the first operation having the highest priority.

In an exemplary implementation, the host 102 is configured to transmit the reset signal to the processor when a duration of the stable state of the second clock signal reaches a third duration.

Figure 2:
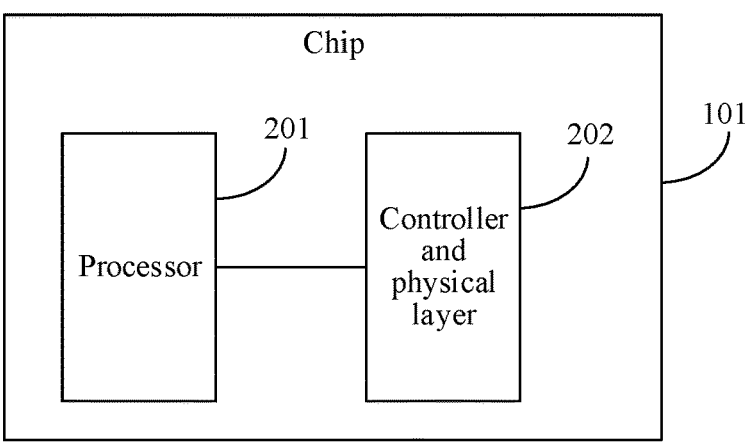
FIG. 2 is a schematic structural diagram of a chip according to an embodiment of this disclosure.

FIG. 2 is a schematic structural diagram of a chip according to an embodiment of this disclosure. As shown in FIG. 2, the chip 101 includes a processor 201, and a controller and physical layer 202. The processor 201 is configured to initialize the controller and physical layer 202 of the chip. The controller and physical layer 202 is also configured to control the chip 101 to enter a Detect state, and the processor 201 is also configured to control the chip to generate a clock signal required by the controller and physical layer 202. The chip provided in this embodiment of this disclosure also includes at least one computer-readable instruction configured to achieve, when run on an electronic device, operations executed in the power-on operation execution method as mentioned below.

In some other embodiments, the electronic device further includes a memory, a peripheral interface, and at least one peripheral. In some embodiments, the peripheral includes at least a radio frequency circuit.

The memory may include one or more computer-readable storage media. The computer-readable storage medium may be non-transitory. The memory also includes a high speed random access memory, and a non-volatile memory, such as one or more magnetic disk storage devices and flash storage devices.

The peripheral interface may be configured to connect the at least one peripheral related to input/output (I/O) to the processor and the memory. In some embodiments, the processor, the memory, and the peripheral interface are integrated on the same chip or circuit board. In some other embodiments, any one or two of the processor, the memory, and the peripheral interface can be implemented on a single chip or circuit board.

The radio frequency circuit is configured to receive and transmit a radio frequency (RF) signal, also referred to as an electromagnetic signal. The radio frequency circuit communicates with a communication network and other communication devices through the electromagnetic signal. The radio frequency circuit converts an electric signal into an electromagnetic signal for transmission, or converts a received electromagnetic signal into an electric signal. In some embodiments, the radio frequency circuit includes: an antenna system, an RF transceiver, one or more amplifiers, a tuner, an oscillator, a digital signal processor, a codec chip set, a subscriber identity module card, and the like. The radio frequency circuit may communicate with another device by using at least one wireless communication protocol. The wireless communication protocol includes but is not limited to: a metropolitan area network, generations of mobile communication networks (2G, 3G, 4G, and 5G), a wireless local area network, and/or a wireless fidelity (WiFi) network.

Figure 3:
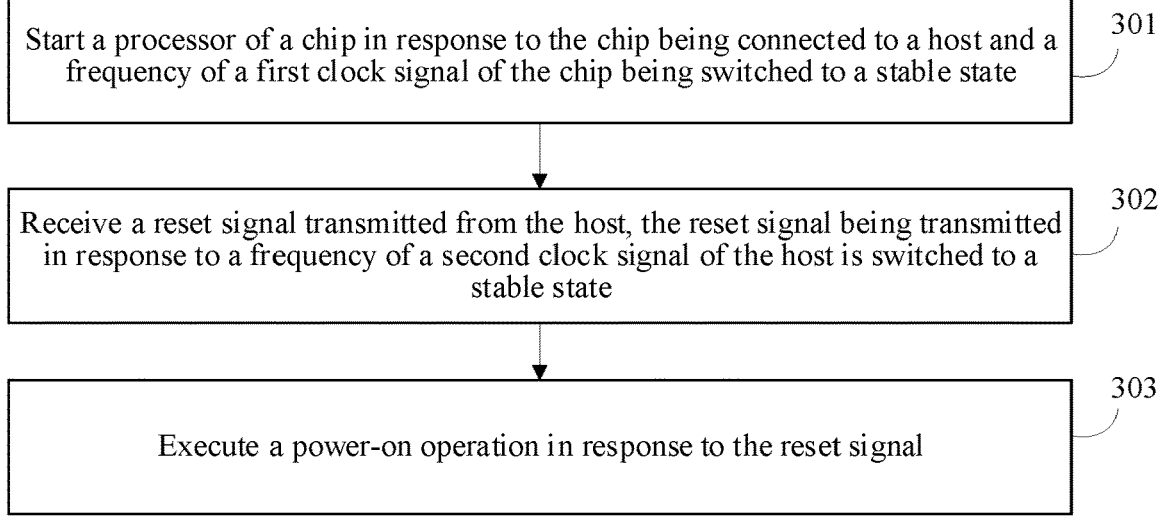
FIG. 3 is a flowchart of a power-on operation execution method according to an embodiment of this disclosure.

FIG. 3 is a flowchart of a power-on operation execution method according to an embodiment of this disclosure. In this embodiment of this disclosure, an executive body is a chip. Referring to FIG. 3, the method includes:

301: Start a processor of the chip after a chip is connected to a host and when a frequency of a first clock signal of the chip is switched to a stable state.

After the chip is connected to the host, a power-on operation needs to be executed on the chip. A power-on process needs to meet a certain timing requirement. For example, when the host is a PCIE host and the chip is a PCIE chip, after the PCIE chip is connected to the PCIE host, the power-on process of the PCIE chip needs to meet a timing requirement of a PCIE protocol, in which, a duration of the power-on process cannot exceed 20 milliseconds.

The chip includes a processor, for example, an Advanced RISC Machines (ARM, a RISC microprocessor) processor. The processor in the chip is a core of operation and control of the chip, and is a final execution unit for information processing and program running. In this embodiment of this disclosure, after the chip is connected to the host, the chip is powered on, and a first clock signal is generated on the chip. During a period of time when the first clock signal is just generated, a frequency of the first clock signal is in an unstable state, also referred to as an uncertain state. During this period, the state of the first clock signal is uncertain. After a period of time, the frequency of the first clock signal gradually tends to be stable. When the frequency of the first clock signal is switched to a stable state, the processor of the chip is started. The processor of the chip is started when the frequency of the first clock signal of the chip is switched to the stable state, interference of the uncertain state of the first clock signal can be avoided, and the accuracy of a clock signal for starting the processor of the chip is ensured.

The clock signal includes a high-level state and a low-level state. The high-level state and the low-level state are separately used for representing high and low states of signal oscillations. The clock signal can play the role of a timer in a synchronizing circuit, which can ensure synchronous running of the various components in the chip through the timer.

302: Receive a reset signal transmitted by the host, the reset signal being transmitted after a frequency of a second clock signal of the host is switched to a stable state.

After the chip is connected to the host, a second clock signal will be generated on the host. During a period of time when the second clock signal is just generated, a frequency of the second clock signal is in an unstable state, also referred to as an uncertain state. During this period, the state of the second clock signal is uncertain. After a period of time, the frequency of the second clock signal gradually tends to be stable. After the frequency of the second clock signal is switched to a stable state, a reset signal is generated on the host, and the host transmits the reset signal to the chip. Therefore, the chip may receive the reset signal transmitted by the host. The reset signal is used for notifying the chip to start a power-on flow.

Due to the fact that the power-on operation of the chip requires the second clock signal with the stable frequency, and the chip cannot know when the frequency of the second clock signal of the host is in a stable state, so that the host needs to transmit the reset signal to the chip after the frequency of the second clock signal is switched to the stable state to notify the chip that the second clock signal has been in the stable state and the power-on flow can be started. The host transmits the reset signal when the frequency of the second clock signal is switched to the stable state, which can avoid the interference of the uncertain state of the second clock signal and ensure the accuracy of the transmitted reset signal.

A time point at which the frequency of the first clock signal is switched to the stable state is earlier than a time point at which the second clock signal is switched to the stable state. Therefore, before the chip receives the reset signal, the processor of the chip can be started. That is, step 301 above is completed before step 302 to ensure that the start of the processor occurs before the receiving of the reset signal, thereby ensuring that there is no need to perform the operation of starting the processor during the subsequent power-on process.

303: Execute a power-on operation in response to the reset signal.

Since the reset signal is transmitted by the host after the frequency of the second clock signal is switched to the stable state, the reset signal is a sign indicating that the second clock signal is in the stable state. The chip can use the second clock signal with the stable frequency to execute the power-on operation. Therefore, the chip executes the power-on operation in response to the reset signal. In this embodiment of this disclosure, the power-on operation refers to an operation executed in a process from the chip receiving a reset signal (PERST #, PCI Express Reset) to the chip entering a Detect state. The power-on process refers to the process from the chip receiving a reset signal to the chip entering the Detect state.

According to the method provided in this embodiment of this disclosure, the processor of the chip is started when the frequency of the first clock signal of the chip is switched to the stable state. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor before the receiving of the reset signal, so there is no need to execute the operation of starting the processor during in power-on process, thereby reducing the duration of the power-on process of the chip.

FIG. 4 is a flowchart of another power-on operation execution method according to an embodiment of this disclosure. In this embodiment of this disclosure, an executive body is a chip. Referring to FIG. 4, the method includes:

401: Start a processor of the chip after a chip is connected to a host and when a frequency of a first clock signal of the chip is switched to a stable state.

To start the processor of the chip, a clock signal with a stable frequency is required. In this embodiment of this disclosure, the first clock signal of the chip is configured to start the processor of the chip. Therefore, when the frequency of the first clock signal of the chip is switched to the stable state, the first clock signal is configured to start the processor of the chip. Therefore, the processor of the chip can be started before the frequency of the second clock signal of the host is switched to the stable state, thereby performing the starting process of the processor before the frequency of the second clock signal is switched to the stable state.

The stable state of the frequency of the first clock signal means that the frequency of the first clock signal remains unchanged. In some embodiments, when the frequency of the first clock signal remains unchanged at a target frequency, the frequency of the first clock signal is in the stable state. For example, the target frequency is 100 Mega Hertz (MHz). In some embodiments, when a duration that the frequency of the first clock signal is the target frequency reaches a fourth duration, it is determined that the frequency of the first clock signal is stabilized to the target frequency. A specific value of the fourth duration can be preset according to an actual scenario. For example, it is set that there are X clock cycles, where X is a positive integer.

In an exemplary implementation, after the chip is connected to the host, the chip is powered on. The chip includes a board-level crystal oscillator. After the chip is powered on, the board-level crystal oscillator generates a first clock signal (ref_clk), and a frequency of the first clock signal is gradually stabilized. In some embodiments, the chip includes a board-level power rail. After the chip is connected to the host, the board-level power rail is gradually transformed to a target voltage. For example, the target voltage is 1.8 volts (V), to provide an Application Specific Integrated Circuit (ASIC) power for the chip. In some embodiments, when the board-level power rail is transformed to the target voltage, a power_on_okay signal is generated on the chip. The power_on_okay signal is used for notifying the chip to enter a ready state. The ready state refers to a state in which the chip is ready to execute the power-on operation.

In an exemplary implementation, the processor of the chip includes an ARM core bootloader and a Boot program. The ARM core bootloader is run before an ARM core is run, to boot the starting of the processor. The Boot program is used for starting the processor of the chip. The chip loads the Boot program through the ARM core bootloader, thereby starting the processor of the chip. In some embodiments, a duration of starting the processor of the chip is approximately 11.53 milliseconds.

402: Initialize a controller and physical layer through the processor based on the first clock signal.

The chip includes a controller and a physical layer (PHY). After the chip starts the processor, the chip initializes the controller and physical layer through the processor based on the first clock signal with the stable frequency. The controller is configured to control an integrated circuit in the chip, and the physical layer is configured to complete functions such as encoding and decoding, scrambling and descrambling, serial-to-parallel conversion, differential transmission and receiving, and link training, to provide a transmission medium for data communication.

To initialize the controller and physical layer, a clock signal with a stable frequency needs to be used. In this embodiment of this disclosure, the first clock signal is configured to initialize the controller and physical layer. Therefore, the controller and physical layer can be initialized before the frequency of the second clock signal of the host is switched to the stable state, thereby performing the initializing process of the controller and physical layer before the frequency of the second clock signal is switched to the stable state.

In an exemplary implementation, the chip performs a frequency conversion operation on the first clock signal to obtain a frequency-converted first clock signal, and initializes the controller and physical layer through the processor based on the frequency-converted first clock signal. The frequency of the first clock signal is a first frequency, for example, 100 Mhz. To initialize the controller and physical layer, a clock signal with second frequency is required. For example, if the second frequency is 50 Mhz, the chip first converts the first clock signal from the first frequency to the second frequency, and then initializes the controller and physical layer through the processor based on the first clock signal with the second frequency.

In an exemplary implementation, the chip includes a Serializer Deserializer (Serdes). The processor of the chip controls the Serdes for driver loading to initialize the controller and physical layer.

It is noted that, the above step 402 only takes the initialization of the controller and physical layer as an example to explain a process that the chip performs the initialization operation. In addition, the initialization operation may also be performed on other components in the chip. This embodiment of this disclosure does not make restrictions on this.

It is noted that, this embodiment of this disclosure only takes the first clock signal as an example to explain a process of initializing the controller and physical layer through the processor. In another embodiment, the controller and physical layer may also be initialized through the processor based on another clock signal, as long as it is ensured that the clock signal is a clock signal with a stable frequency.

403: Determine the second clock signal as a changed clock signal of the controller and physical layer when the initialization of the controller and physical layer is completed.

During the initializing the controller and physical layer, a clock signal of the controller and physical layer is the first clock signal, and subsequent operations performed on the controller and physical layer after the completion of the initialization need to be completed based on the second clock signal of the host. Therefore, when the initialization of the controller and physical layer is completed, the chip determines the second clock signal as the changed clock signal of the controller and physical layer, that is, the second clock signal is provided for the controller and physical layer, instead of the first clock signal.

The second clock signal is a clock signal generated on the host, and the host provides the second clock signal to the chip. After the chip is connected to the host, the second clock signal will be generated on the host. Within a period of time when the second clock signal is just generated, a frequency of the second clock signal is unstable, and the frequency of the second clock signal gradually tends to be stable subsequently. A time point at which the frequency of the second clock signal is switched to the stable state is later than a time point at which the first clock signal is switched to the stable state. When the chip determines the second clock signal as the changed clock signal of the control layer and the physical layer, the second clock signal may be in either an unstable state or a stable state.

In an exemplary implementation, the controller and physical layer is connected to a clock phase locked loop, and the clock signal is provided for the controller and physical layer after entering the clock phase locked loop. During the initializing the controller and physical layer, the chip controls the first clock signal to enter the clock phase locked loop, thereby providing the first clock signal for the controller and physical layer. When the initialization of the controller and physical layer is completed, the chip controls the first clock signal to be stopped from entering the clock phase locked loop, and controls the second clock signal to enter the clock phase locked loop, thereby providing the second clock signal for the controller and physical layer.

A clock Phase Locked Loop is a feedback control circuit used for integrating clock signals. In this embodiment of this disclosure, a function of the clock phase locked loop is converting a frequency of a clock signal.

In some embodiments, the clock phase locked loop is connected to a clock gating. The first clock signal enters the clock phase locked loop through the clock gating. That the chip controls the first clock signal to be stopped from entering the clock phase locked loop, and controls the second clock signal to enter the clock phase locked loop includes: turning off the clock gating to stop the first clock signal from entering the clock phase locked loop; switching the first clock signal reaching the clock gating to the second clock signal when a duration after stopping the first clock signal from entering the clock phase locked loop reaches a first duration; and turning on the clock gating to enable the second clock signal to enter the clock phase locked loop when a duration after switching the first clock signal reaching the clock gating to the second clock signal reaches a second duration, the clock gating.

The clock gating is used for controlling transmission of a clock signal. The clock signal enters the clock gating. When the clock gating is turned on, the clock signal will continue to be transmitted to a next component connected to the clock gating. When the clock gating is turned off, the clock signal will be "stopped" and cannot enter the next component connected to the clock gating. In this embodiment of this disclosure, it is considered that if the first clock signal entering the clock phase locked loop is directly switched to the second clock signal, clock burrs may be generated in the clock switching process. If the clock burrs are transmitted to the clock phase locked loop, it is easy to cause a circuit fault in the clock phase locked loop. Therefore, the clock phase locked loop is connected to the clock gating. Turning off the clock gating can stop the first clock signal from entering the clock phase locked loop. The first clock signal reaching the clock gating can be switched to the second clock signal only when the duration after stopping the first clock signal from entering the clock phase locked loop reaches the first duration. The clock gating is turned on again when the duration after switching the first clock signal reaching the clock gating to the second clock signal reaches the second duration, thereby avoiding the clock burrs.

In some embodiments, the first duration includes N clock cycles, for example, N can be configured as any integer from 2 to 15. In a specific application, a default configuration value of N is 10. The second duration includes M clock cycles, for example, M can be configured as any integer from 2 to 15. In a specific application, a default configuration value of M is 10.

Figure 5:
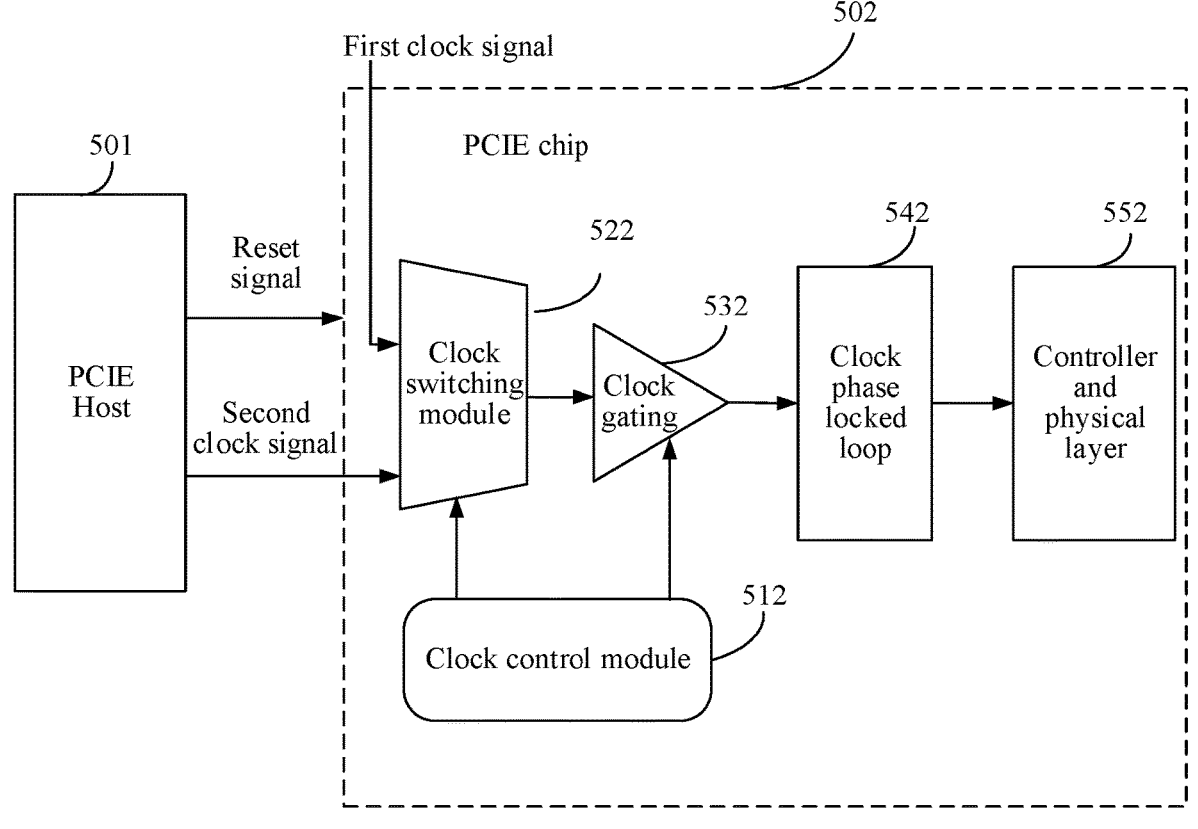
FIG. 5 is a schematic structural diagram of another chip according to an embodiment of this disclosure.

FIG. 5 is a schematic structural diagram of another chip according to an embodiment of this disclosure. A PCIE host 501 and a PCIE chip 502 taken as examples. After the PCIE chip 502 is connected to the PCIE host 501, the PCIE host 501 provides a reset signal and a second clock signal for the PCIE chip 502. The PCIE chip 502 includes a clock control module 512, a clock switching module 522, a clock gating 532, a clock phase locked loop 542, and a controller and physical layer 552. Connection relationships between the various components are shown in FIG. 5 in detail.

The term "module" (and other similar terms such as unit, submodule, etc.) refers to computing software, firmware, hardware, and/or various combinations thereof. At a minimum, however, modules are not to be interpreted as software that is not implemented on hardware, firmware, or recorded on a non-transitory processor readable recordable storage medium. Indeed "module" is to be interpreted to include at least some physical, non-transitory hardware such as a part of a processor or circuitry. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module.

The clock control module 512 is configured to control clock switching module 522 and clock gating 532, clock switching module 522 is configured to switch a clock signal transmitted to clock gating 532. The clock gating 532 is configured to control a clock signal transmitted to clock phase locked loop 542. The clock phase locked loop 542 is configured to perform a frequency conversion operation on the clock signals.

A first clock signal generated on the PCIE chip and a second clock signal provided by the PCIE host are both transmitted to the clock switching module 522. Before the initialization of the controller and physical layer 552 is completed, the clock switching module 522 controls the first clock signal to be transmitted to the clock gating 532, and "stops" the second clock signal. When the initialization of the controller and physical layer 552 is completed, the clock control module 512 controls the clock gating 532 to be turned off, so that the first clock signal is stopped from entering the clock phase locked loop 542. When a duration of stopping the first clock signal from entering the clock phase locked loop 542 reaches a first duration, the clock control module 512 controls the clock switching module 522 to switch the clock signal transmitted to the clock gating 532 from the first clock signal to the second clock signal. When a duration of switching the clock signal transmitted to the clock gating 532 from the first clock signal to the second clock signal reaches a second duration, the clock control module 512 controls the clock gating 532 to be turned on, to enable the second clock signal to enter the clock phase locked loop 542, thereby completing the clock switching from the first clock signal to the second clock signal.

Figure 6:
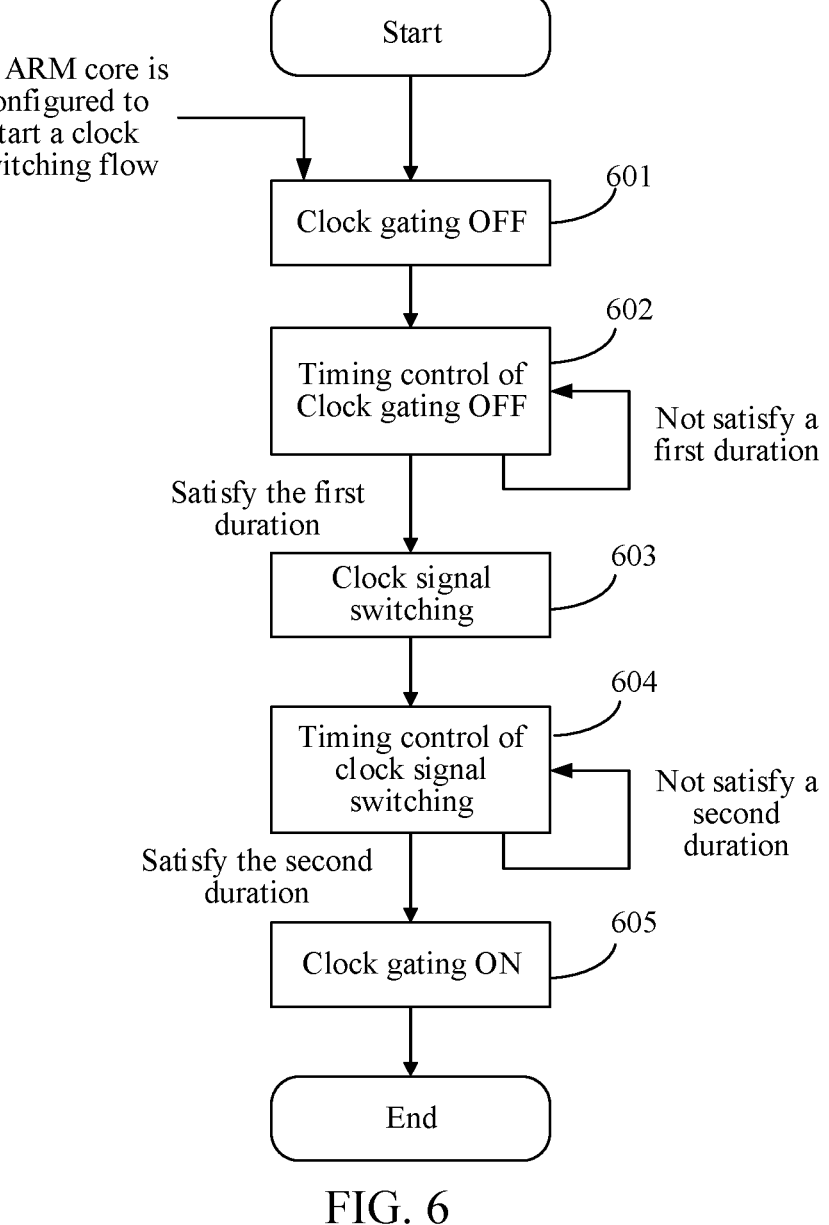
FIG. 6 is a flowchart of a switching method for a clock signal according to an embodiment of this disclosure.

FIG. 6 is a flowchart of a switching method for a clock signal according to an embodiment of this disclosure. As shown in FIG. 6, the method includes the following steps.

601: After the initialization of the controller and physical layer is completed, an ARM core in the chip is configured to start a clock switching flow and control the clock gating in the chip to be switched off, to stop the first clock signal from entering the clock phase locked loop.

602: The chip monitors in real time whether a duration after the clock gating is turned off reaches the first duration; if the duration after the clock gating is turned off reaches the first duration, step 603 below is executed; and if the duration after the clock gating is turned off does not reach the first duration, the clock gating is continued to be turned off.

603: The chip switches the first clock signal reaching the clock gating to the second clock signal.

604: The chip monitors in real time whether a duration after switching the clock signal reaches the second duration; if the duration after switching the clock signal reaches the second duration, step 605 below is executed; and if the duration after switching the clock signal does not reach the second duration, the clock gating is continued to be turned off 605: The clock gating is turned on when the duration after switching the clock signal reaches the second duration, to enable the second clock signal to enter the clock phase locked loop.

In the clock switching process shown in FIG. 6 above, a state of the chip is maintained through a state machine. The states of the various stages and state descriptions are shown in Table 1 below.

TABLE 1

| Name of state | State description |
| --- | --- |
| Start | The chip makes a response to the power_on_okay signal, and the state machine enters the ready state |
| Clock gating OFF | When the state machine receives a configuration instruction from the ARM core and starts the clock switching flow, the state machine is configured to turn off the clock gating |
| Timing control of Clock gating OFF | This state is used for ensuring a timing requirement of clock gating OFF. The state is switched to a next state after the duration of turning off the clock gating reaches the first duration, and the first duration is configured to include 10 clock cycles |
| Clock signal switched | The state machine is configured to switch the clock signal from the first clock signal to the second clock signal |
| Timing control of clock signal switched | This state is used for ensuring a timing requirement of clock signal switched. The state is switched to a next state after the duration of switching the clock signal reaches the second duration, and the second duration is configured to include 10 clock cycles |

TABLE 1-continued

| Name of state | State description |
| --- | --- |
| Clock gating ON | The state machine is configured to turn on the clock gating and transmit the second clock signal to the clock phase locked loop |
| End | The clock switching flow is ended. |

404: Receive a reset signal transmitted by the host, the reset signal being transmitted after the frequency of the second clock signal of the host is switched to a stable state.

After the chip is connected to the host, the second clock signal will be generated on the host. Within a period of time when the second clock signal is just generated, the frequency of the second clock signal is unstable. After a period of time, the frequency of the second clock signal gradually tends to be stable. After the frequency of the second clock signal is switched to the stable state for a period of time, the reset signal is generated on the host, and the host transmits the reset signal to the chip. Therefore, the chip may receive the reset signal transmitted by the host. The reset signal is used for notifying the chip to start a power-on flow. In some embodiments, the reset signal is transmitted when a duration where the second clock signal of the host is in the stable state reaches a third duration. For example, the third duration is minimum of 100 microseconds.

A time point at which the frequency of the first clock signal is switched to the stable state is earlier than a time point at which the second clock signal is switched to the stable state. Therefore, before the chip receives the reset signal, the processor of the chip can be started, and the controller and physical layer can be initialized. That is, step 401 to step 403 above are completed before step 404. In some embodiments, when a duration of keeping the frequency of the first clock signal unchanged reaches a fourth duration, it is determined that the frequency of the first clock signal is switched to the stable state, and when the duration of keeping the frequency of the second clock signal unchanged reaches the fourth duration, it is determined that the frequency of the second clock signal is switched to the stable state.

405: Control, through the processor in response to the reset signal, the clock phase locked loop to perform a frequency conversion operation on the second clock signal, to obtain a frequency-converted second clock signal.

To operate the controller and physical layer, the second clock signal of the host is required. The second clock signal of the host is a clock signal with a third frequency. For example, the third frequency is 100 Mhz, while the controller and physical layer need to use the second clock signal with a fourth frequency. For example, the fourth frequency is 500 Mhz or 250 Mhz. Therefore, before the second clock signal is provided for the controller and physical layer, the clock phase locked loop first needs to be controlled through the processor to perform the frequency conversion operation on the second clock signal to convert the second clock signal with the third frequency to the second clock signal with the fourth frequency, thereby obtaining a clock signal required to operate the controller and physical layer.

406: Control the chip to enter a Detect state through the controller and physical layer based on the frequency-converted second clock signal.

After the chip obtains the frequency-converted second clock signal, the chip is controlled to enter the Detect state through the initialized controller and physical layer and the frequency-converted second clock signal. The Detect state is also referred to as a Link Training and Status State Machine (LTSSM) Detect state. The Detect state is an initial state of link training.

It is noted that, the chip performs a power-on operation in response to the reset signal by executing step 405 to step 406. In this embodiment of this disclosure, the power-on operation includes the frequency conversion operation performed on the second clock signal and the control of the chip to enter the Detect state. In another embodiment, the power-on operation of the chip may also include other operations.

It is noted that, in an exemplary implementation, the power-on operation includes a first operation executed by the processor, and the processor is configured to execute the first operation in response to an operation instruction corresponding to the first operation. For example, the first operation refers to controlling the clock phase locked loop to perform the frequency conversion operation on the second clock signal in step 405 above. The power-on operation execution method in this embodiment of this disclosure further includes at least one of the following:

(1) the chip further includes other components besides the processor. The chip controls, during the executing the power-on operation, other components to stop transmitting, to the processor, operation instructions corresponding to other operations except the first operation.

For example, other components include a direct memory access (DMA), a register, or the like. In order to reduce the duration of the power-on operation, during the executing the power-on operation, other components are controlled to stop transmitting, to the processor, operation instructions corresponding to other operations except the first operation, so that the processor can only receive the operation instruction corresponding to the first operation. Therefore, resources of the processor not be occupied by other operations, ensuring that the processor can execute the first operation in a timely manner. This reduces a duration at which the processor executes the first operation, thereby reducing the duration of the power-on operation.

(2) A response is made to the operation instructions through the processor according to priorities, the operation instruction corresponding to the first operation having the highest priority.

The processor of the chip makes a response to the various operation instructions in sequence according to the priorities of the various received operation instructions. Since the operation instruction corresponding to the first operation has the highest priority, the processor may preferentially make a response to the operation instruction corresponding to the first operation, thereby timely executing the first operation in the power-on operation, reducing the duration at which the processor executes the first operation, and thus reducing the duration of the power-on operation.

In related technologies, the chip uses the second clock signal of the host to start the processor of the chip and initialize the controller and physical layer. Therefore, the chip may start the processor of the chip and initialize the controller and physical layer only after receiving a reset signal. The power-on process of the chip includes the starting process of the processor, the frequency conversion process of the second clock signal, the initializing process of the controller and physical layer, and the process of entering the Detect state, so that the power-on process of the chip takes a long time. As a result, the power-on process does not meet the timing requirement. For example, in the PCIE protocol, the timing requirement of the power-on process is that the duration of the power-on process is not to exceed 20 milliseconds. In practical applications, the starting process of the processor takes T0=11.53 milliseconds; the frequency conversion process of the second clock signal takes T1=0.84 milliseconds; the initializing process of the controller and physical layer takes T2=7.56 milliseconds; the process of entering the Detect state takes T3=1.32 milliseconds. In addition, the duration of the power-on process also includes a duration of configuration and response of the processor, which is T4=1 millisecond. Therefore, the duration of the power-on process is T0+T1+T2+T3+T4=22.25 milliseconds, which exceeds 20 ms required in the PCIE protocol. Therefore, there is a possibility that the chip may not be powered on normally on the host. As a result, the chip fails in working.

In this embodiment of this disclosure, the chip uses the first clock signal to start the processor of the chip and initialize the controller and physical layer. Therefore, when the first clock signal is stable, the processor of the chip can be started, and the controller and physical layer can be initialized, without wait to receive a reset signal. Therefore, the power-on process of the chip only includes the frequency conversion process of the second clock signal and the process of entering the Detect state, thereby reducing the duration of the power-on process of the chip.

Figure 7:
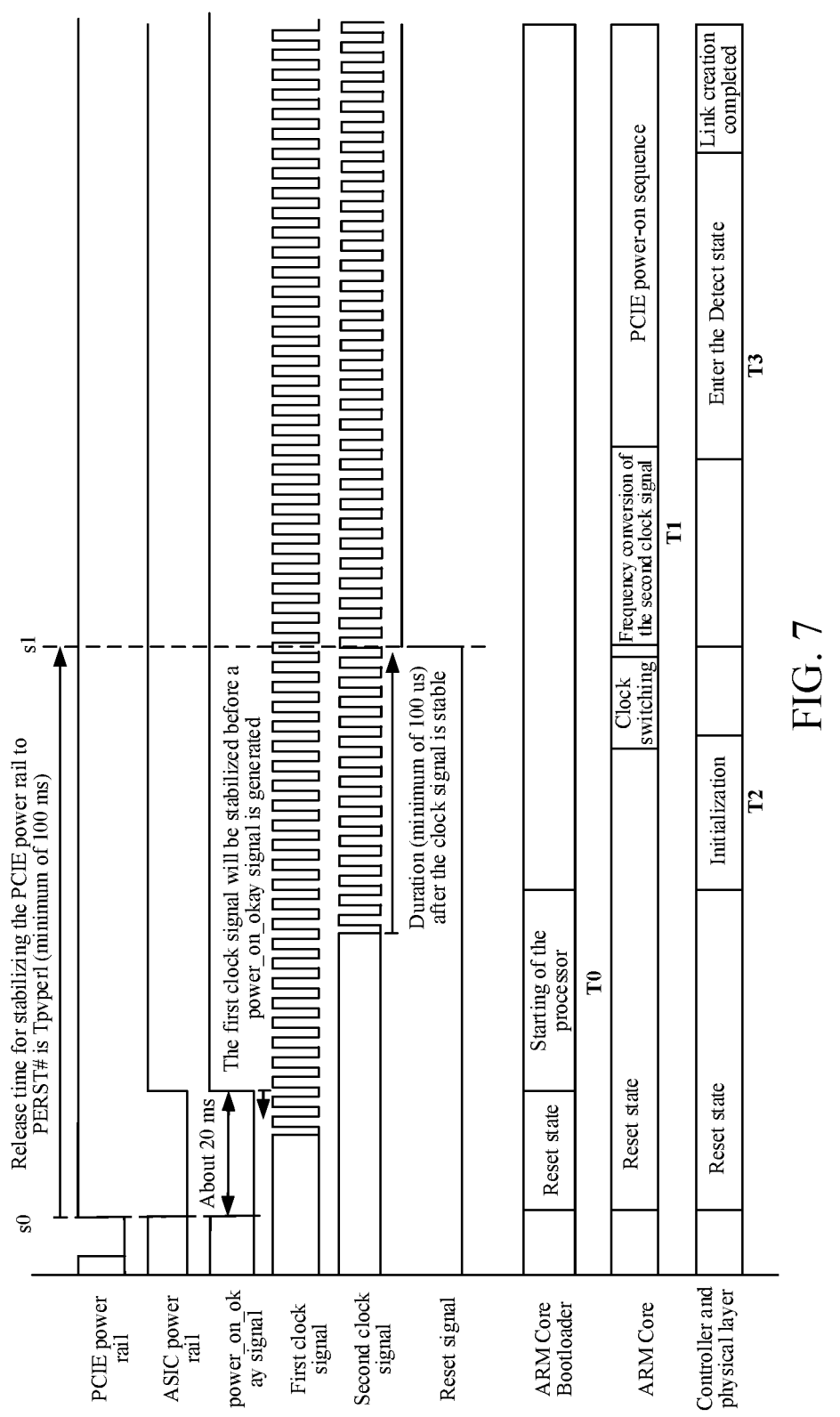
FIG. 7 is a timing diagram of a power-on operation execution method according to an embodiment of this disclosure.

FIG. 7 is a timing diagram of a power-on operation execution method according to an embodiment of this disclosure. As shown in FIG. 7, time s0 represents time when the chip is connected to the host. Starting from time s0, the board-level power rail of the chip starts to be transformed to 1.8 V, to provide an ASIC power for the chip. After the transformation is completed, the power_on_okay signal is pulled up, and a duration from connecting the chip the host to pulling up the power_on_okay signal is about 20 milliseconds. Before the power_on_okay signal is pulled up, the frequency of the first clock signal provided by the board-level crystal oscillator for the chip is stabilized to 100 Mhz.

As shown in FIG. 7, when the frequency of the first clock signal is stabilized to 100 Mhz, the ARM Core Bootloader starts the processor by loading the Boot program, and a duration of starting the processor is TO. When the starting of the processor is completed, the controller and physical layer is initialized by controlling, through the processor, the Serdes to perform driver loading. A duration of initializing the controller and physical layer is T2. When the initialization of the controller and physical layer is completed, a clock signal of the controller and physical layer is controlled to be switched from the first clock signal to the second clock signal ARM Core. At this time, the preparation work before the power-on operation of the chip is completed.

As shown in FIG. 7, when a duration where the second clock signal of the host is in the stable state reaches 100 microseconds, the host generates a reset signal and transmits the reset signal to the chip. Time s1 represents time when the reset signal is generated. At this time, the ARM Core controls the clock phase locked loop to perform a frequency conversion operation on the second clock signal to obtain a frequency-converted second clock signal. A duration of performing the frequency conversion operation on the second clock signal is T1. When the frequency-converted second clock signal is obtained, the chip is controlled to enter the Detect state through the controller and physical layer, and a duration of entering the Detect state is T3. The process from the chip receiving the reset signal to the chip entering the Detect state is the power-on process of the chip.

In practical applications, T1=0.84 milliseconds and T3=1.32 milliseconds. In addition, the duration of the power-on process also includes a duration of configuration and response of the processor, which is T4=1 milliseconds. Therefore, in this embodiment of this disclosure, the duration of the power-on process is T1+T3+T4=3.16 milliseconds, which fully meets the requirement of 20 ms in the PCIE protocol.

According to the method provided in this embodiment of this disclosure, the processor of the chip is started when the frequency of the first clock signal of the chip is switched to the stable state. After the processor is started, the controller and physical layer is initialized. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor and the initializing process of the controller and physical layer before the receiving of the reset signal, so there is no need to execute the operations of starting the processor and initializing the controller and physical layer during in power-on process, thereby reducing the duration of the power-on process of the chip.

Moreover, since the duration of the power-on operation of the chip is shortened, it can be ensured that the power-on process meets the timing requirement, thereby ensuring normal work of the chip and improving the adaptability of the chip to different hosts.

Furthermore, during the clock signal switching the first clock signal reaching the clock gating is switched to the second clock signal when the duration after stopping the first clock signal from entering the clock phase locked loop reaches the first duration; and the clock gating is turned on again when the duration after switching the first clock signal reaching the clock gating to the second clock signal reaches the second duration, which can avoid clock burrs generated in the clock signal switching process.

Furthermore, during the executing the power-on operation, other components are controlled to stop transmitting, to the processor, operation instructions corresponding to other operations except the first operation, so that the processor can only receive the operation instruction corresponding to the first operation. Therefore, resources of the processor not be occupied by other operations, ensuring that the processor can execute the first operation in a timely manner. This reduces a duration at which the processor executes the first operation, thereby reducing the duration of the power-on operation.

In addition, the processor may preferentially make a response to the operation instruction corresponding to the first operation, thereby timely executing the first operation in the power-on operation, reducing the duration at which the processor executes the first operation, and thus reducing the duration of the power-on operation.

In this embodiment of FIG. 4, the starting process of the processor and the initializing process of the controller and physical layer is performed before the receiving of the reset signal, so that the duration of the power-on operation is reduced. In another embodiment, the starting process of the processor may be performed before the receiving of the reset signal only, and the initializing process of the controller and physical layer may still be executed as part of the power-on process after the receiving of the reset signal. The specific process is shown in the embodiment of FIG. 8 below.

FIG. 8 is a flowchart of still another power-on operation execution method according to an embodiment of this disclosure. In this embodiment of this disclosure, an executive body is a chip. Referring to FIG. 8, the method includes:

801: Start a processor of the chip after a chip is connected to a host and when a frequency of a first clock signal of the chip is switched to a stable state.

The starting process of the processor in step 801 is the same as the starting process of the processor in step 401 above, and will not be repeated here.

802: Receive a reset signal transmitted by the host, the reset signal being transmitted after the frequency of the second clock signal of the host is switched to a stable state.

A time point at which the frequency of the first clock signal is switched to the stable state is earlier than a time point at which the second clock signal is switched to the stable state. The process of receiving the reset signal in step 801 is similar to the process of receiving the reset signal in step 404 above, and will not be repeated here.

803: Control, through the processor in response to the reset signal, the clock phase locked loop to perform a frequency conversion operation on the second clock signal, to obtain a frequency-converted second clock signal.

The controller and physical layer is connected to a clock phase locked loop. The frequency conversion process of the second clock signal in step 803 is similar to the frequency conversion process of the second clock signal in step 405 above, and will not be repeated here.

804: Initialize the controller and physical layer through the processor.

The chip includes the controller and physical layer. The chip initializes the controller and physical layer through the processor based on the frequency-converted second clock signal in response to the reset signal of the host.

A difference between the initializing process of the controller and physical layer in step 804 and the initializing process of the controller and physical layer in step 402 above is that the initializing time and the clock signal for initialization are different. In step 402 above, the controller and physical layer is initialized after the starting of the processor is completed. At this time, the first clock signal of the chip has been in the stable state, and the second clock signal of the host is not in the stable state. Therefore, the controller and physical layer is initialized based on the first clock signal. The initialization is a part of the power-on operation. However, in step 804, the controller and physical layer is initialized after the frequency conversion of the second clock signal is completed. Since the frequency-converted second clock signal has been obtained at this time, the controller and physical layer is initialized directly based on the frequency-converted second clock signal. The initialization is a part of the power-on operation.

In addition, the initializing process of the controller and physical layer in step 804 is similar to the initializing process of the controller and physical layer in step 402, and will not be repeated here.

805: Control the chip to enter a Detect state through the controller and physical layer based on the frequency-converted second clock signal.

The process of controlling the chip to enter the Detect state in step 805 is similar to the process of controlling the chip to enter the Detect state in step 406 above, and will not be repeated here.

It is noted that, this embodiment of this disclosure takes above step 803 to step 805 as an example, which indicates that the chip performs the frequency conversion operation on the second clock signal through the processor in response to the reset signal to obtain the frequency-converted second clock signal; the chip is initialized through the processor; and the chip is controlled to enter the Detect state based on the frequency-converted second clock signal. In addition, the chip can also perform the frequency conversion operation on the second clock signal in other ways, or the chip can also be controlled to enter the Detect state in other ways. This embodiment of this disclosure does not make restrictions on this.

It is noted that, in an exemplary implementation, the power-on operation includes a first operation executed by the processor, and the processor is configured to execute the first operation in response to an operation instruction corresponding to the first operation. For example, the first operation refers to controlling the clock phase locked loop to perform the frequency conversion operation on the second clock signal in step 803 above. The power-on operation execution method in this embodiment of this disclosure further includes at least one of the following:

(1) the chip further includes other components besides the processor. The chip controls, during the executing the power-on operation, other components to stop transmitting, to the processor, operation instructions corresponding to other operations except the first operation.

(2) A response is made to the operation instructions through the processor according to priorities, the operation instruction corresponding to the first operation having the highest priority.

According to the method provided in this embodiment of this disclosure, the processor of the chip is started when the frequency of the first clock signal of the chip is switched to the stable state. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor before the receiving of the reset signal, so there is no need to execute the operation of starting the processor during in power-on process, thereby reducing the duration of the power-on process of the chip.

Moreover, since the duration of the power-on operation of the chip is shortened, it can be ensured that the power-on process meets the timing requirement, thereby ensuring normal work of the chip and improving the adaptability of the chip to different hosts.

Furthermore, during the executing the power-on operation, other components are controlled to stop transmitting, to the processor, operation instructions corresponding to other operations except the first operation, so that the processor can only receive the operation instruction corresponding to the first operation. Therefore, resources of the processor not be occupied by other operations, ensuring that the processor can execute the first operation in a timely manner. This reduces a duration at which the processor executes the first operation, thereby reducing the duration of the power-on operation.

In addition, the processor may preferentially make a response to the operation instruction corresponding to the first operation, thereby timely executing the first operation in the power-on operation, reducing the duration at which the processor executes the first operation, and thus reducing the duration of the power-on operation.

FIG. 9 is a flowchart of yet another power-on operation execution method according to an embodiment of this disclosure. An executive body of this embodiment of this disclosure is an electronic device. The electronic device includes a chip and a processor. Referring to FIG. 9, the method includes:

901: Start a processor of the chip after a chip is connected to a host and when a frequency of a first clock signal of the chip is switched to a stable state.

The starting process of the processor in step 901 is the same as the starting process of the processor in step 401 above, and will not be repeated here.

902: Transmit a reset signal through the host to the processor after a frequency of a second clock signal of the host is switched to a stable state.

After the chip is connected to the host, the second clock signal will be generated on the host. Within a period of time when the second clock signal is just generated, the frequency of the second clock signal is unstable. The frequency of the second clock signal gradually tends to be stable subsequently. After a period of time of switching the frequency of the second clock signal to the stable state, a reset signal is generated on the host, and the host transmits the reset signal to the chip.

In an exemplary implementation, when a duration of the stable state of the second clock signal of the host reaches a third duration, the host transmits the reset signal to the processor. When the duration of the stable state of the second clock signal reaches the third duration, the host generates the reset signal, and the electronic device transmits the reset signal to the chip through the host. In some embodiments, the chip is a PCIE chip, and the host is the PCIE host. The third duration is stipulated according to the PCIE protocol. For example, the third duration is minimum of 100 microseconds.

A time point at which the frequency of the first clock signal is switched to the stable state is earlier than a time point at which the second clock signal is switched to the stable state.

903: Receive the reset signal through the processor, and execute a power-on operation in response to the reset signal.

The electronic device receives the reset signal transmitted by the host through the processor of the chip. The reset signal is used for notifying the chip to start the power-on flow. The chip executes the power-on operation in response to the reset signal.

The process of performing the power-on operation on the chip in step 903 is similar to the processes of above step 803 to step 805, and will not be repeated here. Or, after the processor of the chip is started, the electronic device initializes the controller and physical layer through the processor. When the initialization of the controller and physical layer is completed, the second clock signal is determined as a changed clock signal of the controller and physical layer, so that the process of performing the power-on operation on the chip in step 903 is similar to the processes of above step 405 to step 406, and will not be repeated here.

According to the method provided in this embodiment of this disclosure, the processor of the chip is started when the frequency of the first clock signal of the chip is switched to the stable state. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor before the receiving of the reset signal, so there is no need to execute the operation of starting the processor during in power-on process, thereby reducing the duration of the power-on process of the chip.

Figure 10:
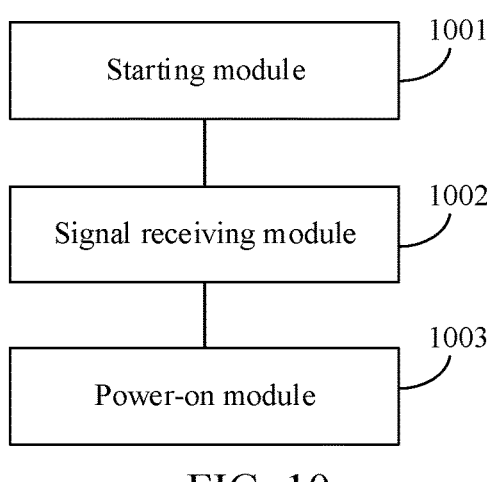
FIG. 10 is a schematic structural diagram of a power-on operation execution apparatus according to an embodiment of this disclosure.

FIG. 10 is a schematic structural diagram of a power-on operation execution apparatus according to an embodiment of this disclosure. Referring to FIG. 10, the apparatus includes:

a starting module 1001, configured to start a processor of the chip after a chip is connected to a host and when a frequency of a first clock signal of the chip is switched to a stable state;

a signal receiving module 1002, configured to receive a reset signal transmitted by the host, the reset signal being transmitted after a frequency of a second clock signal of the host is switched to a stable state; and a power-on module 1003, configured to execute a power-on operation in response to the reset signal.

A time point at which the frequency of the first clock signal is switched to the stable state is earlier than a time point at which the second clock signal is switched to the stable state.

According to the power-on operation execution apparatus provided in this embodiment of this disclosure, the processor of the chip is started when the frequency of the first clock signal of the chip is switched to the stable state. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor before the receiving of the reset signal, so there is no need to execute the operation of starting the processor during in power-on process, thereby reducing the duration of the power-on process of the chip.

Figure 11:
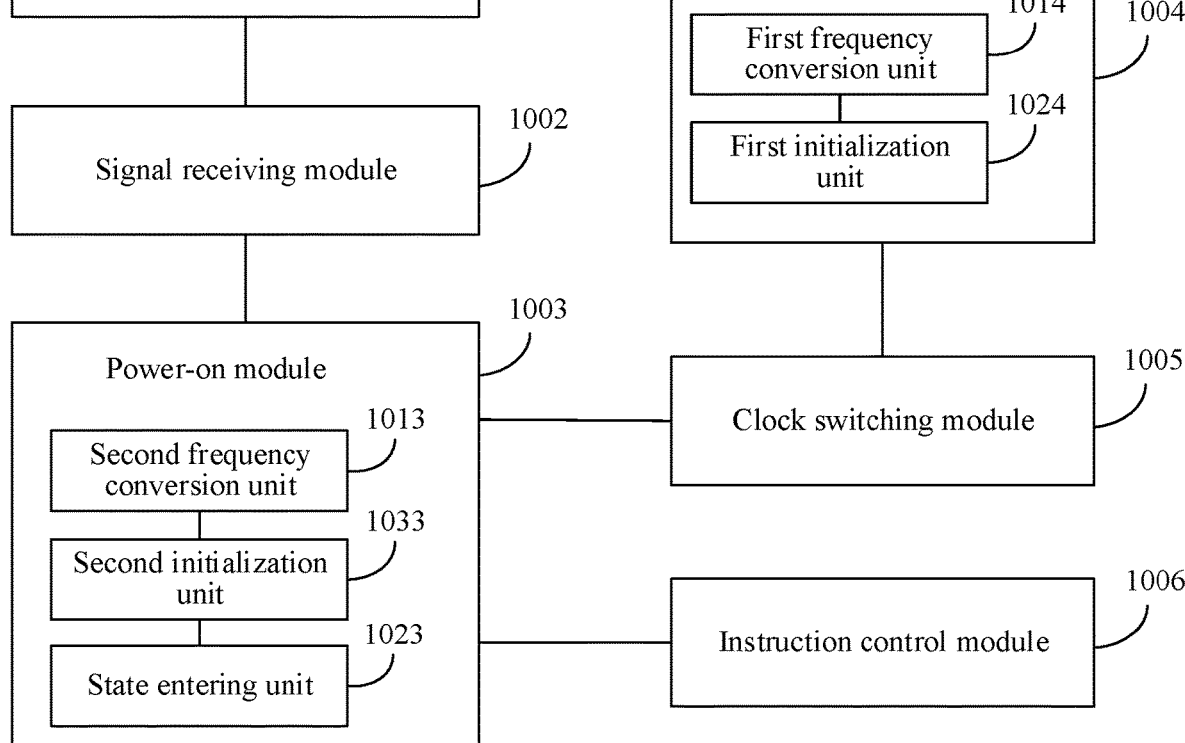
FIG. 11 is a schematic structural diagram of another power-on operation execution apparatus according to an embodiment of this disclosure.

In some embodiments, referring to FIG. 11, the apparatus further includes:

an initialization module 1004, configured to initialize the chip through the processor.

In some embodiments, referring to FIG. 11, the chip includes a controller and a physical layer, and the initialization module 1004 is configured to initialize the controller and physical layer through the processor.

In some embodiments, the initialization module 1004 is configured to initialize the controller and physical layer through the processor based on the first clock signal.

In some embodiments, referring to FIG. 11, the initialization module 1004 includes:

a first frequency conversion unit 1014, configured to perform a frequency conversion operation on the first clock signal to obtain a frequency-converted first clock signal; and a first initialization unit 1024, configured to initialize the controller and physical layer through the processor based on the frequency-converted first clock signal.

In some embodiments, referring to FIG. 11, during the initializing the controller and physical layer, a clock signal of the controller and physical layer is the first clock signal. The apparatus further includes:

a clock switching module 1005, configured to determine the second clock signal as a changed clock signal of the controller and physical layer when the initialization of the controller and physical layer is completed.

In some embodiments, referring to FIG. 11, the controller and physical layer is connected to a clock phase locked loop; and the clock switching module 1005 is configured to: when the initialization of the controller and physical layer is completed, control the first clock signal to be stopped from entering the clock phase locked loop, and control the second clock signal to enter the clock phase locked loop.

In some embodiments, referring to FIG. 11, the clock phase locked loop is connected to a clock gating. The first clock signal enters the clock phase locked loop through the clock gating. The clock switching module 1005 is configured to:

turn off the clock gating to stop the first clock signal from entering the clock phase locked loop;

switch, when a duration after stopping the first clock signal from entering the clock phase locked loop reaches a first duration, the first clock signal reaching the clock gating to the second clock signal; and turn on the clock gating when a duration after switching the first clock signal reaching the clock gating to the second clock signal reaches a second duration, to enable the second clock signal to enter the clock phase locked loop.

In some embodiments, referring to FIG. 11, the controller and physical layer is connected to a clock phase locked loop, and the power-on module 1003 includes:

a second frequency conversion unit 1013, configured to control, through the processor in response to the reset signal, the clock phase locked loop to perform a frequency conversion operation on the second clock signal, to obtain a frequency-converted second clock signal; and a state entering unit 1023, configured to control the chip to enter a Detect state through the controller and physical layer based on the frequency-converted second clock signal.

In some embodiments, referring to FIG. 11, the power-on module 1003 includes:

a second frequency conversion unit 1013, configured to perform a frequency conversion operation on the second clock signal through the processor in response to the reset signal, to obtain a frequency-converted second clock signal;

a second initialization unit 1033, configured to initialize the chip through the processor; and a state entering unit 1023, configured to control the chip to enter a Detect state based on the frequency-converted second clock signal.

In some embodiments, referring to FIG. 11, the chip includes a controller and a physical layer; and the controller and physical layer is connected to a clock phase locked loop. The second frequency conversion unit 1013 is configured to control, through the processor, the clock phase locked loop to perform the frequency conversion operation on the second clock signal, to obtain the frequency-converted second clock signal.

The second initialization unit 1033 is configured to initialize the controller and physical layer through the processor.

The state entering unit 1023 is configured to control the chip to enter the Detect state through the controller and physical layer based on the frequency-converted second clock signal.

In some embodiments, referring to FIG. 11, the power-on operation includes a first operation executed by the processor, and the processor is configured to execute the first operation in response to an operation instruction corresponding to the first operation. The apparatus further includes an instruction control module 1006, configured to execute at least of the following:

the chip further including other components besides the processor, controlling, during the executing the power-on operation, other components to stop transmitting, to the processor, operation instructions corresponding to other operations except the first operation; and making a response to the operation instructions through the processor according to priorities, the operation instruction corresponding to the first operation having the highest priority.

It is noted that, the power-on operation execution apparatus provided by the above embodiments is only illustrated by dividing the functional modules during the execution of the power-on operation. In practical applications, the foregoing functions may be allocated to and completed by different functional modules as required, that is, an inner structure of a chip is divided into different functional modules, so as to complete all or some of the functions described above. In addition, the power-on operation execution apparatus embodiment provided above belongs to the same conception as the power-on operation execution method embodiment. For details of the specific implementation process, refer to the method embodiment.

Figure 12:
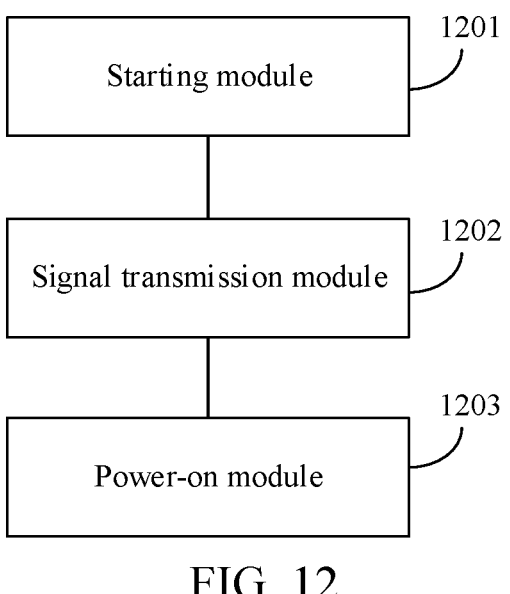
FIG. 12 is a schematic structural diagram of still another power-on operation execution apparatus according to an embodiment of this disclosure.

FIG. 12 is a schematic structural diagram of still another power-on operation execution apparatus according to an embodiment of this disclosure. Referring to FIG. 12, the apparatus includes:

a starting module 1201, configured to start a processor of the chip after a chip is connected to a host and when a frequency of a first clock signal of the chip is switched to a stable state;

a signal transmission module 1202, configured to transmit a reset signal through the host to the processor after a frequency of a second clock signal of the host is switched to a stable state; and a power-on module 1203, configured to: receive the reset signal through the processor, and execute a power-on operation in response to the reset signal.

A time point at which the frequency of the first clock signal is switched to the stable state is earlier than a time point at which the second clock signal is switched to the stable state.

According to the power-on operation execution apparatus provided in this embodiment of this disclosure, the processor of the chip is started when the frequency of the first clock signal of the chip is switched to the stable state. When the frequency of the second clock signal of the host is switched to the stable state, the chip receives the reset signal and executes the power-on operation in response to the reset signal. Since the time point at which the frequency of the first clock signal is switched to the stable state is earlier than the time point at which the second clock signal is switched to the stable state, which is equivalent to performing the starting process of the processor before the receiving of the reset signal, so there is no need to execute the operation of starting the processor during in power-on process, thereby reducing the duration of the power-on process of the chip.

In some embodiments, the signal transmission module 1202 is configured to transmit, through the host, the reset signal to the processor when a duration of the stable state of the second clock signal reaches a third duration.

It is noted that, the power-on operation execution apparatus provided by the above embodiments is only illustrated by dividing the functional modules during the execution of the power-on operation. In practical applications, the foregoing functions may be allocated to and completed by different functional modules as required, that is, an inner structure of an electronic device is divided into different functional modules, so as to complete all or some of the functions described above. In addition, the power-on operation execution apparatus embodiment provided above belongs to the same conception as the power-on operation execution method embodiment. For details of the specific implementation process, refer to the method embodiment.

A person of ordinary skill in the art may understand that all or some of the steps of the foregoing embodiments may be implemented by hardware, or may be implemented by a program instructing relevant hardware. The program may be stored in a computer-readable storage medium. The storage medium mentioned above may be a read-only memory, a magnetic disk, an optical disc, or the like.

All or some of the foregoing embodiments may be implemented by using software, hardware, firmware, or any combination thereof. When software is used to implement the embodiments, all or a part of the embodiments may be implemented in a form of a computer program product. The computer program product includes one or more computer-readable instructions. When the computer-readable instructions are loaded and executed on a computer, the flows or functions according to the embodiments of the present invention are all or partially generated.

The foregoing descriptions are merely exemplary embodiments of the embodiments of this disclosure, but are not intended to limit the embodiments of this disclosure. Any modification, equivalent replacement, or improvement made within the spirit and principle of the embodiments of this disclosure shall fall within the protection scope of this disclosure.

What is claimed is:

1. A power-on operation execution method, performed by a chip, comprising:

starting a processor of the chip in response to the chip being connected to a host and a frequency of a first clock signal of the chip being switched to a stable state, wherein the chip comprises a clock gating, a clock phase locked loop, and a controller and physical layer;

controlling the first clock signal to enter the clock phase locked loop through the clock gating;

receiving a reset signal transmitted from the host, the reset signal being transmitted in response to a frequency of a second clock signal generated on the host being switched to a stable state;

executing a power-on operation in response to the reset signal, a time point at which the frequency of the first clock signal is switched to the stable state being earlier than a time point at which the frequency of the second clock signal is switched to the stable state;

initializing the controller and physical layer with the processor; and in response to the initialization of the controller and physical layer being completed, turning off the clock gating to stop the first clock signal from entering the clock phase locked loop;

switching the first clock signal reaching the clock gating to the second clock signal in response to a duration after stopping the first clock signal from entering the clock phase locked loop reaching a first duration; and turning on the clock gating to enable the second clock signal to enter the clock phase locked loop in response to a duration after switching the first clock signal reaching the clock gating to the second clock signal reaching a second duration.

2. The method according to claim 1, wherein the initializing the controller and physical layer with the processor comprises:

initializing the controller and physical layer with the processor based on the first clock signal.

3. The method according to claim 2, wherein the initializing the controller and physical layer with the processor based on the first clock signal comprises:

performing a frequency conversion operation on the first clock signal to obtain a frequency-converted first clock signal; and initializing the controller and physical layer with the processor based on the frequency-converted first clock signal.

4. The method according to claim 1, wherein a clock signal of the controller and physical layer is the first clock signal, and the method further comprises:

determining the second clock signal as a changed clock signal of the controller and physical layer in response to initialization of the controller and physical layer being completed.

5. The method according to claim 4, wherein the controller and physical layer is connected to the clock phase locked loop.

6. The method according to claim 1, wherein the controller and physical layer is connected to a clock phase locked loop, and the executing the power-on operation in response to the reset signal comprises:

in response to the reset signal, controlling, with the processor, the clock phase locked loop to perform a frequency conversion operation on the second clock signal, to obtain a frequency-converted second clock signal; and controlling the chip to enter a Detect state through the controller and physical layer based on the frequency-converted second clock signal.

7. The method according to claim 1, wherein the executing the power-on operation in response to the reset signal comprises:

performing a frequency conversion operation on the second clock signal with the processor in response to the reset signal, to obtain a frequency-converted second clock signal;

initializing the chip with the processor; and controlling the chip to enter a Detect state based on the frequency-converted second clock signal.

8. The method according to claim 7, wherein the chip comprises a controller and physical layer, the controller and physical layer is connected to a clock phase locked loop, and the performing the frequency conversion operation on the second clock signal to obtain the frequency-converted second clock signal comprises:

controlling, with the processor, the clock phase locked loop to perform the frequency conversion operation on the second clock signal, to obtain a frequency-converted second clock signal;

the initializing the chip with the processor comprises:

initializing the controller and physical layer with the processor; and the controlling the chip to enter the Detect state based on the frequency-converted second clock signal comprises:

controlling the chip to enter the Detect state through the controller and physical layer based on the frequency-converted second clock signal.

9. The method according to claim 1, wherein the power-on operation comprises a first operation executed by the processor, the chip further comprising other components besides the processor, and the method further comprises:

controlling, during the executing the power-on operation, other components to stop transmitting, to the processor, operation instructions corresponding to other operations except the first operation.

10. The method according to claim 1, wherein the power-on operation comprises a first operation executed by the processor, and the method further comprises:

making a response to operation instructions with the processor according to priorities, an operation instruction corresponding to the first operation having a highest priority.

11. A power-on operation execution apparatus, comprising:

a memory operable to store computer-readable instructions; and a processor circuitry operable to read the computer-readable instructions, the processor circuitry when executing the computer-readable instructions is configured to:

start a processor of a chip in response to the chip being connected to a host and a frequency of a first clock signal of the chip being switched to a stable state, wherein the chip comprises a clock gating, a clock phase locked loop, and a controller and physical layer;

control the first clock signal to enter the clock phase locked loop via the clock gating;

receive a reset signal transmitted from the host, the reset signal being transmitted in response to a frequency of a second clock signal generated on the host being switched to a stable state;

execute a power-on operation in response to the reset signal, a time point at which the frequency of the first clock signal is switched to the stable state being earlier than a time point at which the frequency of the second clock signal is switched to the stable state;

initialize the controller and physical layer with the processor;

in response to the initialization of the controller and physical layer being completed, turn off the clock gating to stop the first clock signal from entering the clock phase locked loop;

switch the first clock signal reaching the clock gating to the second clock signal in response to a duration after stopping the first clock signal from entering the clock phase locked loop reaching a first duration; and turn on the clock gating to enable the second clock signal to enter the clock phase locked loop in response to a duration after switching the first clock signal reaching the clock gating to the second clock signal reaching a second duration.

12. The apparatus according to claim 11, wherein the processor circuitry is configured to:

initialize the controller and physical layer with the processor based on the first clock signal.

\* \* \* \* \*